US009799824B2

(12) United States Patent
Xia et al.

(10) Patent No.: US 9,799,824 B2
(45) Date of Patent: Oct. 24, 2017

(54) STT-MRAM DESIGN ENHANCED BY SWITCHING CURRENT INDUCED MAGNETIC FIELD

(71) Applicant: QUALCOMM Incorporated, San Diego, CA (US)

(72) Inventors: William H. Xia, San Diego, CA (US); Wenqing Wu, San Diego, CA (US); Kendrick H. Yuen, San Diego, CA (US); Abhishek Banerjee, Kanpur (IN); Xia Li, San Diego, CA (US); Seung H. Kang, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/170,851

(22) Filed: Jun. 1, 2016

(65) Prior Publication Data

US 2016/0276576 A1   Sep. 22, 2016

Related U.S. Application Data

(62) Division of application No. 13/770,306, filed on Feb. 19, 2013, now Pat. No. 9,385,305.

(51) Int. Cl.
  *H01L 43/08*  (2006.01)
  *H01L 43/02*  (2006.01)
  *H01L 43/12*  (2006.01)
  *G11C 11/16*  (2006.01)

(52) U.S. Cl.
  CPC ............ *H01L 43/02* (2013.01); *G11C 11/161* (2013.01); *H01L 43/08* (2013.01); *H01L 43/12* (2013.01)

(58) Field of Classification Search
  CPC .............................. H01L 43/02; H01L 43/08
  See application file for complete search history.

(56) References Cited

U.S. PATENT DOCUMENTS

| 7,289,356 | B2 | 10/2007 | Diao et al. |
| 7,612,969 | B2 | 11/2009 | Oh et al. |
| 7,738,287 | B2 | 6/2010 | Diao et al. |
| 2008/0062580 | A1 | 3/2008 | Inokuchi et al. |
| 2008/0179699 | A1 | 7/2008 | Horng et al. |

(Continued)

FOREIGN PATENT DOCUMENTS

| CN | 101064114 A | 10/2007 |
| CN | 101140944 A | 3/2008 |

(Continued)

OTHER PUBLICATIONS

International Search Report and Written Opinion—PCT/US2014/015858—ISA/EPO—May 12, 2014.

*Primary Examiner* — Yu-Hsi D Sun
(74) *Attorney, Agent, or Firm* — Qualcomm Incorporated/Seyfarth

(57) ABSTRACT

A memory cell includes an elongated first electrode coupled to a magnetic tunnel junction (MTJ) structure and an elongated second electrode aligned with the elongated first electrode coupled to the MTJ structure. The elongated electrodes are configured to direct mutually additive portions of a switching current induced magnetic field through the MTJ. The mutually additive portions enhance switching of the MTJ in response to application of the switching current.

20 Claims, 11 Drawing Sheets

(56) References Cited

U.S. PATENT DOCUMENTS

| | | | |
|---|---|---|---|
| 2010/0120176 | A1 | 5/2010 | Misumi et al. |
| 2011/0229985 | A1 | 9/2011 | Li |
| 2011/0273928 | A1 | 11/2011 | Ong et al. |
| 2012/0032287 | A1* | 2/2012 | Li et al. .................. 257/421 |
| 2012/0074511 | A1 | 3/2012 | Takahashi et al. |
| 2012/0250405 | A1 | 10/2012 | Wang et al. |
| 2014/0231940 | A1 | 8/2014 | Xia et al. |

FOREIGN PATENT DOCUMENTS

| | | | |
|---|---|---|---|
| JP | 2003109374 | A | 4/2003 |
| JP | 2007194300 | A | 8/2007 |
| JP | 2008066606 | A | 3/2008 |
| JP | 2008243992 | A | 10/2008 |
| JP | 2009093781 | A | 4/2009 |
| JP | 2009151835 | A | 7/2009 |
| WO | 2012019135 | A2 | 2/2012 |

* cited by examiner

STT-MRAM DESIGN ENHANCED BY SWITCHING CURRENT INDUCED MAGNETIC FIELD

CROSS-REFERENCE TO RELATED APPLICATION

The present application is a divisional of U.S. patent application Ser. No. 13/770,306, filed on Feb. 19, 2013, and entitled "STT-MRAM DESIGN ENHANCED BY SWITCHING CURRENT INDUCED MAGNETIC FIELD," the disclosure of which is expressly incorporated by reference herein in its entirety.

TECHNICAL FIELD

The present disclosure generally relates to magnetic random access memory (MRAM) devices. More specifically, the present disclosure relates to a design for spin transfer torque (STT) MRAM devices that are enhanced by a spin-transfer torque switching current induced magnetic field.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic 0 and a logic 1 value stored by the MTJ.

To determine whether data in a conventional MRAM represents a logic 1 or a logic 0, the resistance of the MTJ in the bitcell is compared with a reference resistance. The reference resistance in conventional MRAM circuitry is a midpoint resistance between the resistance of an MTJ having a parallel magnetic orientation and an MTJ having an anti-parallel magnetic orientation. One way of generating a midpoint reference resistance is coupling in parallel an MTJ known to have a parallel magnetic orientation and an MTJ known to have an anti-parallel magnetic orientation.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

SUMMARY

According to an aspect of the present disclosure, a memory cell has a set of magnetic tunnel junction (MTJ) layers. The set of MTJ layers includes a fixed layer, a free layer and a barrier layer between the fixed layer and the free layer. The memory cell also includes a first electrode coupled to a first one of the MTJ layers. The first electrode includes a first elongated portion extending laterally away from the MTJ layers. The memory cell also includes a second electrode coupled to a second one of the MTJ layers. The second electrode includes a second elongated portion extending laterally away from the MTJ layers. The first elongated portion is configured to direct a first portion of a magnetic field induced by an MTJ switching current through the MTJ layers. The second elongated portion is configured to direct a second portion of the magnetic field induced by the MTJ switching current through the MTJ layers. According to aspects of the present disclosure, the second portion of the magnetic field adds with the first portion of the magnetic field to enhance the magnetic field through the MTJ layers.

According to another aspect of the present disclosure, a method of constructing a magnetic memory cell includes patterning a first electrode. The method also includes fabricating an MTJ on the first electrode so that the first electrode has a first elongated portion extending laterally away from the MTJ. The method further includes patterning a second electrode on the MTJ so that the second electrode has a second elongated portion extending laterally away from the MTJ. The method also includes configuring the first elongated portion and the second elongated portion to direct mutually additive portions of a switching current induced magnetic field through the MTJ.

Another aspect of the present disclosure includes an apparatus that includes a means for magnetically storing charge, a first means for conducting and a second means for conducting. The means for magnetically storing charge has a set of layers, the set of layers including a fixed layer, a free layer and a barrier layer between the fixed layer and the free layer. The first means for conducting is coupled to a first one of the set of layers of the means for magnetically storing charge. The first means for conducting also includes a first means for directing a magnetic field that extends laterally away from the means for magnetically storing charge. The first means for directing a magnetic field is configured to direct a first portion of a magnetic field induced by a switching current through the means for magnetically storing charge. The second means for conducting is coupled to a second one of the set of layers of the means for magnetically storing charge. The second means for conducting also includes a second means for directing magnetic field that extends laterally away from the means for magnetically storing charge. The second means for directing magnetic field is configured to direct a second portion of the magnetic field induced by the switching current through the means for magnetically storing charge. The second portion of the magnetic field also adds with the first portion of the magnetic field to enhance the magnetic field through the means for magnetically storing charge.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
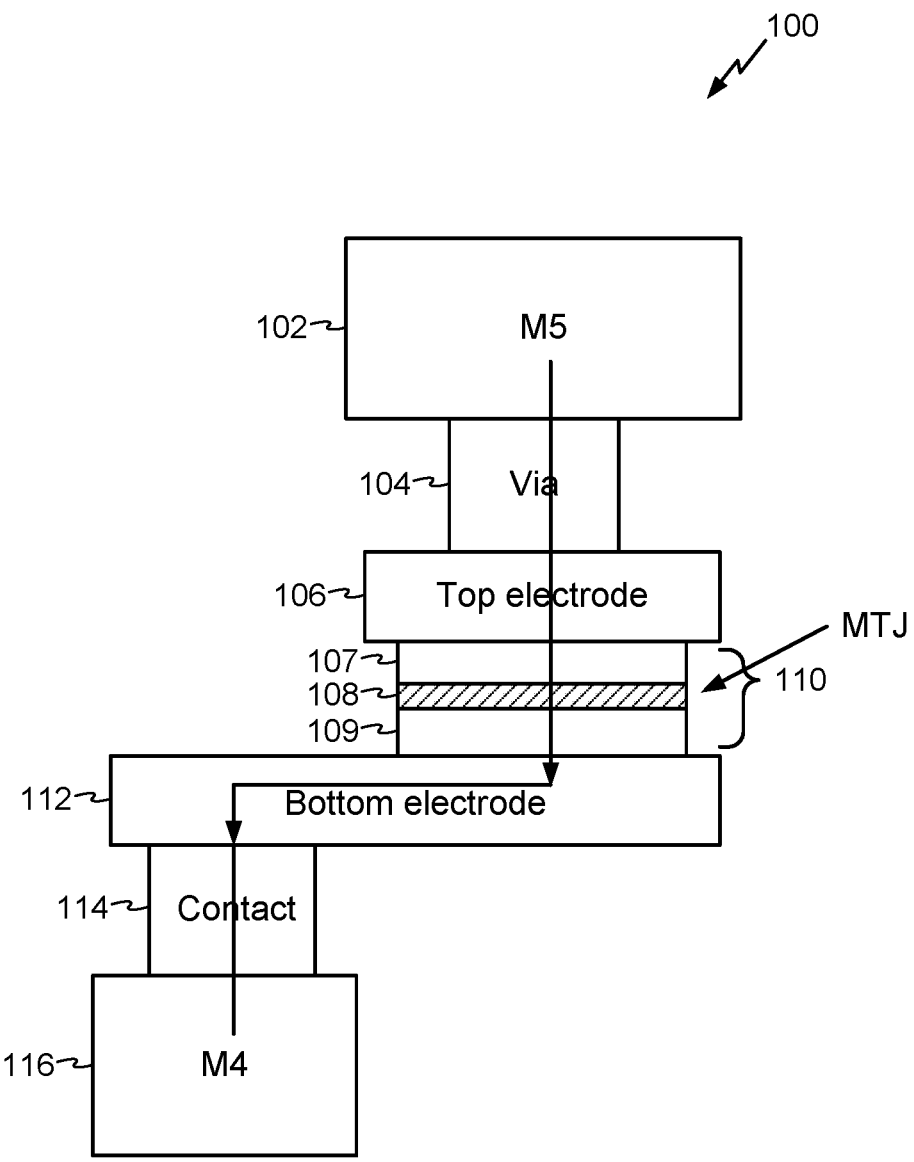
FIG. 1 is a block diagram of a conventional STT-MRAM design.

FIG. 1 is a block diagram of a conventional spin transfer torque magnetic random access memory (STT-MRAM) 100. The conventional MRAM structure 100 includes a magnetic tunnel junction (MTJ) 110 that has a first ferromagnetic layer 107 a second ferromagnetic layer 109 and a tunnel barrier layer 108 coupled between the first ferromagnetic layer 107 and the second ferromagnetic layer 109. A top electrode 106 is coupled to the first ferromagnetic layer 107 and a bottom electrode 112 is coupled to the second ferromagnetic layer 109. A top conductive layer 102 is coupled to the top electrode 106 by a conductive via 104. A bottom conductive layer 116 is coupled to the bottom electrode 112 by a conductive via 114. The first ferromagnetic layer 107 may be a fixed layer and the second ferromagnetic layer 109 may be a free layer, for example. In another implementation, the first ferromagnetic layer 107 may be a free layer and the second ferromagnetic layer 109 may be a fixed layer. The tunnel barrier layer 108 may be made from an insulating material, such as magnesium oxide MgO, for example.

Figure 2A:
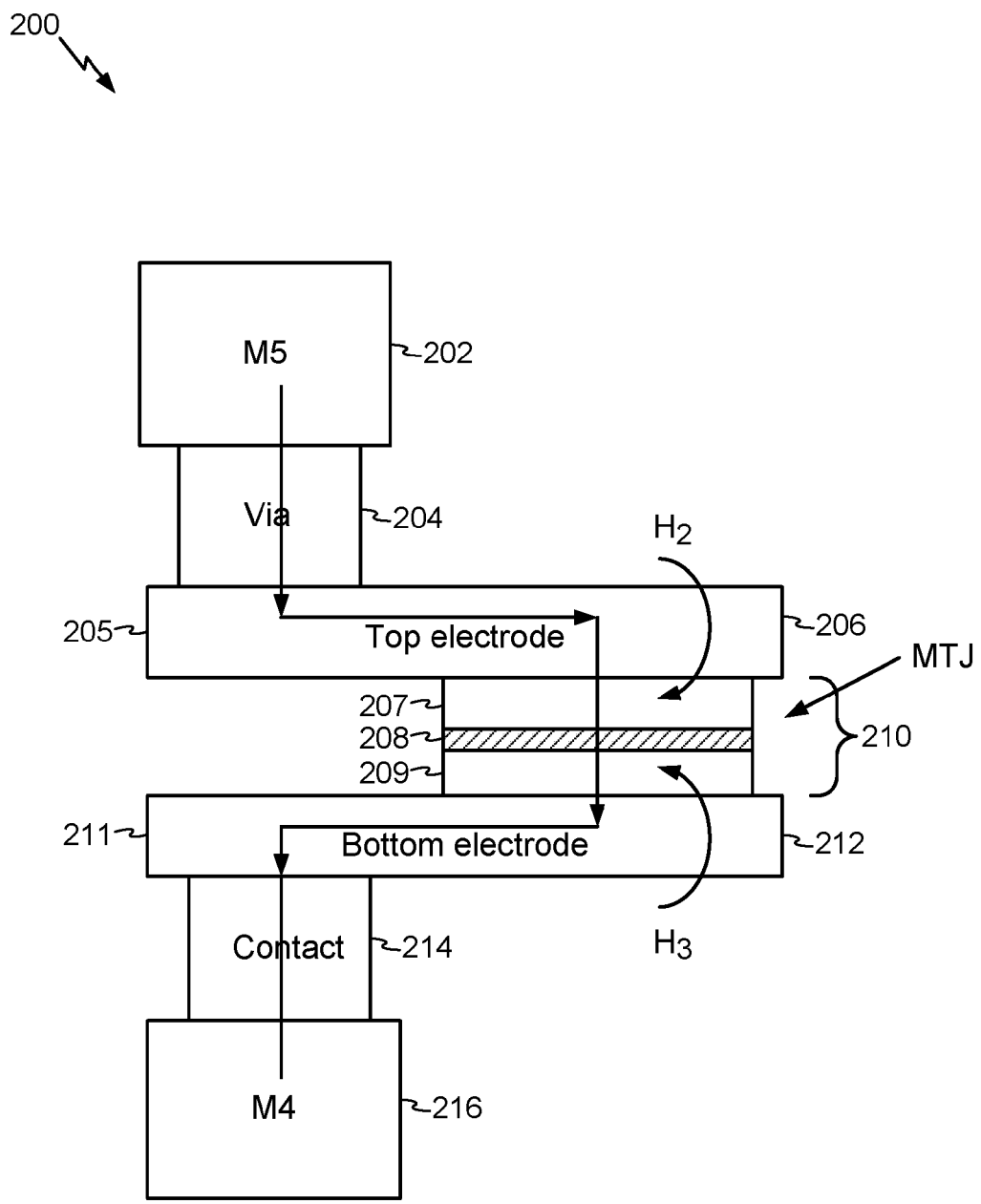
FIG. 2A is a block diagram of an STT-MRAM according to an aspect of the present disclosure.

FIG. 2A is a block diagram of an STT-MRAM 200 according to an aspect of the present disclosure. The STT-MRAM 200 includes an MTJ 210 that includes a top ferromagnetic layer 207, a bottom ferromagnetic layer 209 and a tunnel barrier layer 208, coupled between the top ferromagnetic layer 207 and the bottom ferromagnetic layer 209. In one implementation, the top ferromagnetic layer 207 may be a free layer and the bottom ferromagnetic layer 209 may be a fixed layer, for example. In another implementation, the top ferromagnetic layer 207 may be a fixed layer and the bottom ferromagnetic layer 209 may be a free layer. The tunnel barrier layer 208 may be made from an insulating material, such as MgO, for example.

The top ferromagnetic layer 207 is coupled to a top electrode 206 and the bottom ferromagnetic layer 209 is coupled to a bottom electrode 212. A top conductive layer 202, such as metal layer M5, is coupled to the top electrode 206 by a top via 204 and a bottom conductive layer 216, such as metal layer M4, is coupled to the bottom electrode 212 by a bottom via 214, also referred to as a contact.

According to an aspect of the present disclosure, the top conductive layer 202 and bottom conductive layer 216 are laterally offset from the MTJ 210. The top electrode 206 includes an elongated portion 205 that extends laterally from the MTJ 210 to the top via 204. The bottom electrode 212 also includes an elongated portion 211 that extends laterally from the MTJ 210 to the bottom via 214.

Figure 2B:
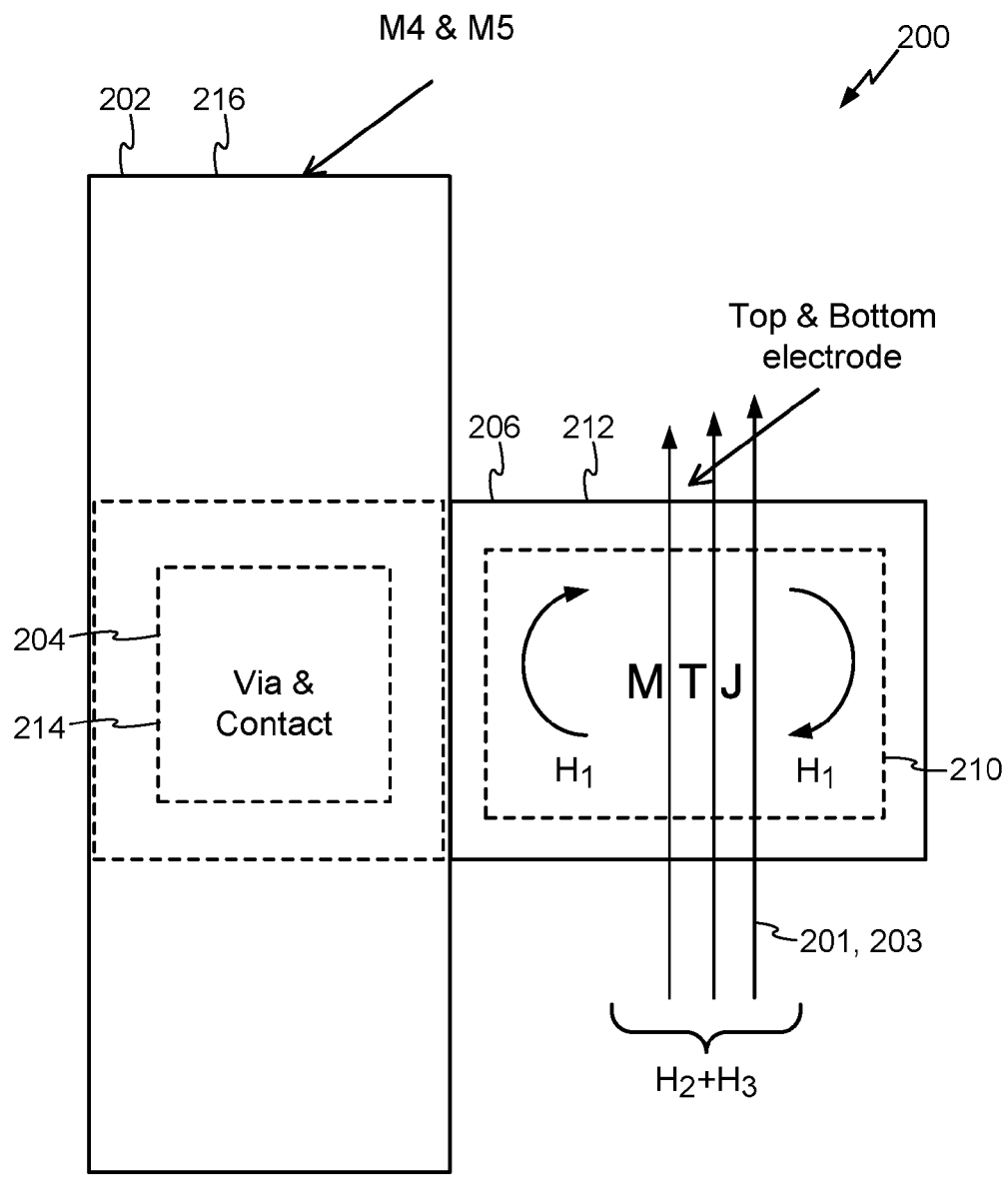
FIG. 2B is a top view diagram of an STT-MRAM according to an aspect of the present disclosure.

FIG. 2B is a top view of the STT-MRAM structure 200 shown in FIG. 2A in which dotted lines denote hidden layers. For instance, in FIG. 2B, the MTJ 210 is hidden under the top electrode 206. The top via 204 and the bottom via 214 are hidden under the top conductive layer 202.

As can be seen in both FIG. 2A and FIG. 2B, the top electrode 206 and the bottom electrode 212 are substantially aligned with each other. The elongated portion 205 of the top electrode 206 is also substantially aligned with the elongated portion 211 of the bottom electrode 212. A switching current applied to the MTJ 210 flows along a current path from the top conductive layer 202 to the top electrode 206, through the MTJ 210 to the bottom electrode 212 and then to the bottom conductive layer 216. According to aspects of the present disclosure, the lateral displacement between the top conductive layer 202 and the MTJ 210 causes the switching current to flow laterally, e.g., in a plane parallel to the MTJ layers, in both the top electrode 206 and the bottom electrode 212. A magnetic field is naturally induced around the current path by the switching current when the switching current is applied to the MTJ 210. As in a conventional MTJ configuration, the switching current traveling through the MTJ 210 from the top ferromagnetic layer 207 to the bottom ferromagnetic layer 209 induces a first portion ($H_1$) (shown in FIG. 2B) of the magnetic field that circulates around the current path parallel to the planes of the MTJ layers 207, 208, 209.

According to aspects of the present disclosure, the switching current traveling in the top electrode 206 from the top via 204 to the MTJ 210 induces a second portion ($H_2$) of the magnetic field that circulates around the switching current in the top electrode 206. It should be understood by persons having ordinary skill in the art that the second portion $H_2$ of the magnetic field is directed through the MTJ 210 as shown by the magnetic field vector 201 in the direction shown in FIGS. 2A and 2B.

According to aspects of the present disclosure, the switching current traveling in the bottom electrode 212 from the MTJ 210 to the bottom via 214 induces a third portion ($H_3$) of the magnetic field that circulates around the current in the bottom electrode 212. It should be understood by persons having ordinary skill in the art that the third portion $H_3$ of the magnetic field is directed through the MTJ 210 as shown by the magnetic field vector 203 in the direction shown in FIGS. 2A and 2B.

According to aspects of the present disclosure, the substantial mutual alignment (i.e., pattern) of elongated portions 205, 211 of the top and bottom electrodes causes the second portion $H_2$ of the magnetic field and the third portion $H_3$ of the magnetic field to be mutually additive in one direction through the MTJ 210.

Persons having ordinary skill in the art should recognize that an axis of the MTJ that is aligned in the most energetically favorable direction of magnetization is generally referred to as the MTJ's "easy axis". For example, an MTJ may be configured with an elliptical shape, in which the easy axis of the MTJ 210 corresponds to a long axis of the elliptical shape. In FIG. 2B, the MTJ 210 has a rectangular shape and the easy axis of the MTJ 210 corresponds to the long axis of the rectangular shape.

According to an aspect of the present disclosure, the top electrode 206 and bottom electrode 212 are arranged so that the mutually additive portions $H_2$ and $H_3$ of a magnetic field induced by a switching current applied to the MTJ 210 are directed through the MTJ 210 in a direction perpendicular to the MTJ's easy axis.

Figure 3A:
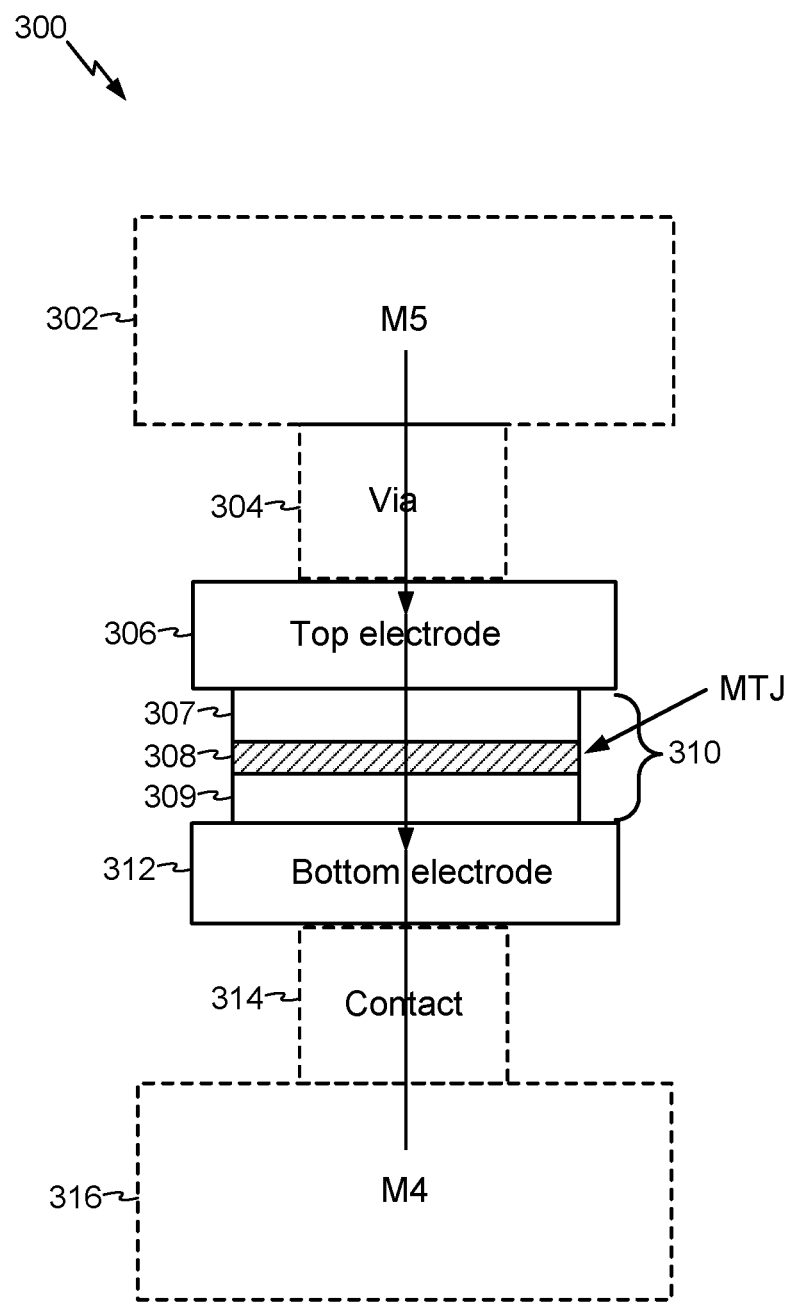
FIG. 3A is a block diagram of an STT-MRAM according to an aspect of the present disclosure.

According to another aspect of the present disclosure described with reference to FIGS. 3A and 3B, the mutually additive portions $H_2$ and $H_3$ of a magnetic field induced by a switching current applied to an MTJ may be directed through the MTJ in a direction parallel to the MTJ's easy axis. FIG. 3A is a block diagram of an STT-MRAM 300 according to an aspect of the present disclosure. The STT-MRAM 300 includes an MTJ 310 that has a top ferromagnetic layer 307, a bottom ferromagnetic layer 309 and a tunnel barrier layer 308, coupled between the top ferromagnetic layer 307 and the bottom ferromagnetic layer 309. In one implementation, the top ferromagnetic layer 307 may be a free layer and the bottom ferromagnetic layer 309 may be a fixed layer, for example. In another implementation, the top ferromagnetic layer 307 may be a fixed layer and the bottom ferromagnetic layer 309 may be a free layer. The tunnel barrier layer 308 may be made from an insulating material, such as MgO, for example.

The top ferromagnetic layer 307 is coupled to a top electrode 306 and the bottom ferromagnetic layer 309 is coupled to a bottom electrode 312. A top conductive layer 302, such as metal layer M5, is coupled to the top electrode 306 by a top via 304 and a bottom conductive layer 316, such as metal layer M4, is coupled to the bottom electrode 312 by a bottom via 314, also referred to as a contact.

Figure 3B:
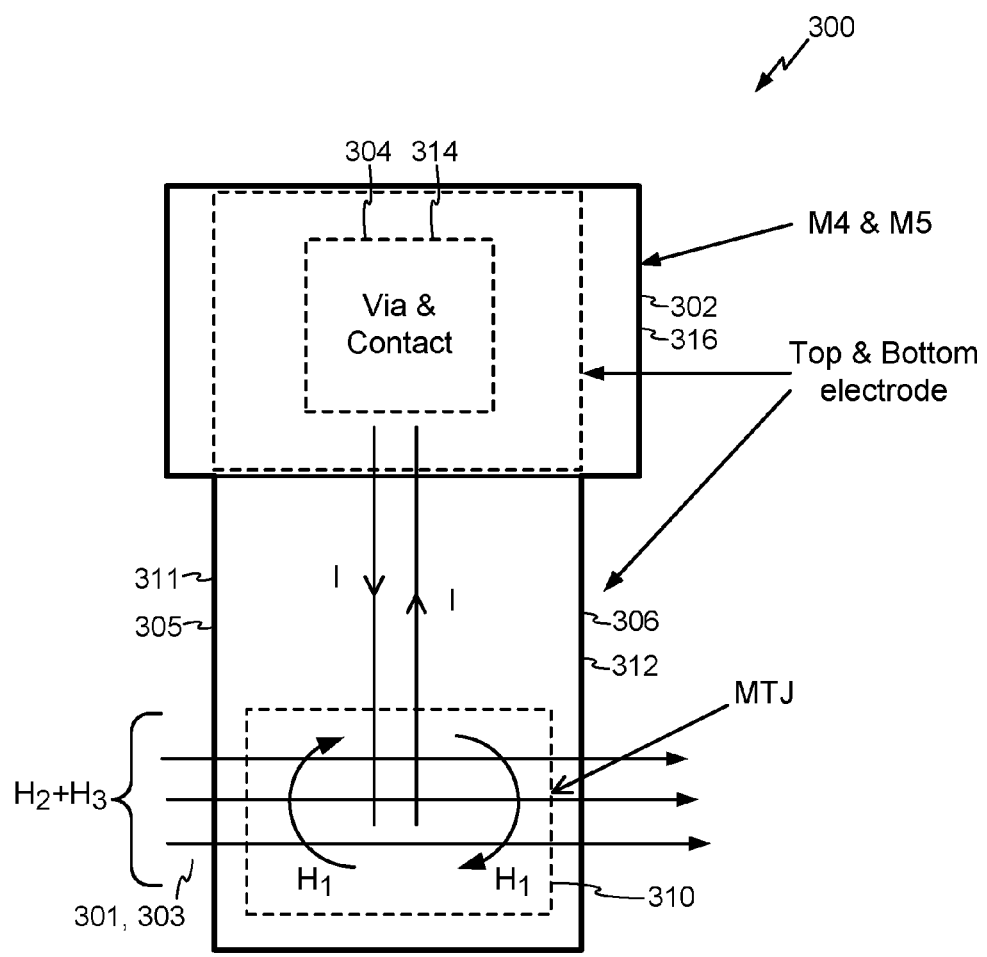
FIG. 3B is a top view diagram of STT-MRAM according to an aspect of the present disclosure.

FIG. 3B is a top view of the STT-MRAM structure 300 shown in FIG. 3A in which dotted lines denote hidden layers. For instance, in FIG. 3B, the MTJ 310 is hidden under the top electrode 306. The top via 304 and the bottom via 314 are hidden under the top conductive layer 302.

As best seen in FIG. 3B, the top conductive layer 302 and bottom conductive layer 316 include portions that are laterally offset from the MTJ 310. The top electrode 306 includes an elongated portion 305 that extends laterally from the MTJ 310 to the top via 304. The bottom electrode 312 also includes an elongated portion 311 that extends laterally from the MTJ 310 to the bottom via 314.

As can be seen in both FIG. 3A and FIG. 3B, the top electrode 306 and the bottom electrode 312 are substantially aligned with each other. The elongated portion 305 of the top electrode 306 is also substantially aligned with the elongated portion 311 of the bottom electrode 312. A switching current applied to the MTJ 310 flows along a current path from the top conductive layer 302 to the top electrode 306, through the MTJ 310 to the bottom electrode 312 and then to the bottom conductive layer 316. According to aspects of the present disclosure, the lateral displacement between the top conductive layer 302 and the MTJ 310 causes the switching current to flow laterally, e.g., in a plane parallel to the MTJ layers, in both the top electrode 306 and the bottom electrode 312.

A magnetic field is naturally induced around the current path by the switching current when the switching current is applied to the MTJ 310. As in a conventional MTJ configuration, the switching current traveling through the MTJ 310 from the top ferromagnetic layer 307 to the bottom ferromagnetic layer 309 induces a first portion ($H_1$) (shown in FIG. 3B) of the magnetic field that circulates around the current path parallel to the planes of the MTJ layers 307, 308, 309.

According to aspects of the present disclosure, the switching current traveling in the top electrode 306 from the top via 304 to the MTJ 310 induces a second portion ($H_2$) of the magnetic field that circulates around the switching current in the top electrode 306. It should be understood by persons having ordinary skill in the art that the second portion $H_2$ of the magnetic field is directed through the MTJ 310 as shown by the magnetic field vector 301 in the direction shown in FIG. 3B.

According to aspects of the present disclosure, the switching current traveling in the bottom electrode 312 from the MTJ 310 to the bottom via 314 induces a third portion ($H_3$) of the magnetic field that circulates around the current in the bottom electrode 312. It should be understood by persons having ordinary skill in the art that the third portion $H_3$ of the magnetic field is directed through the MTJ 310 as shown by the magnetic field vector 303 in the direction shown in FIGS. 3B.

According to aspects of the present disclosure, the substantial mutual alignment (i.e., pattern) of elongated portions 305, 311 of the top and bottom electrodes 306, 312 causes the second portion $H_2$ of the magnetic field and the third portion $H_3$ of the magnetic field to be mutually additive in one direction through the MTJ 310.

In FIG. 3B, the MTJ 310 has a rectangular shape and the easy axis of the MTJ 310 corresponds to the long axis of the rectangular shape. According to an aspect of the present disclosure, the top electrode 306 and bottom electrode 312 are arranged so that the mutually additive portions $H_2$ and $H_3$ of a magnetic field induced by a switching current applied to the MTJ 310 are directed through the MTJ 310 in a direction parallel to the MTJ's easy axis.

The electrodes 306, 312 are designed to control the magnetic field induced by the internal switching current more effectively. The thickness of the electrodes 306, 312 can be increased by addition of more electrode material or by being combined with other conductive layers (e.g., layers 302, 316 and other layers) in order to reduce the current-resistance or IR drop across the STT-MRAM device. Therefore, the switching time and the switching energy consumption are lowered, leading to improved efficiency and performance.

Figure 4A:
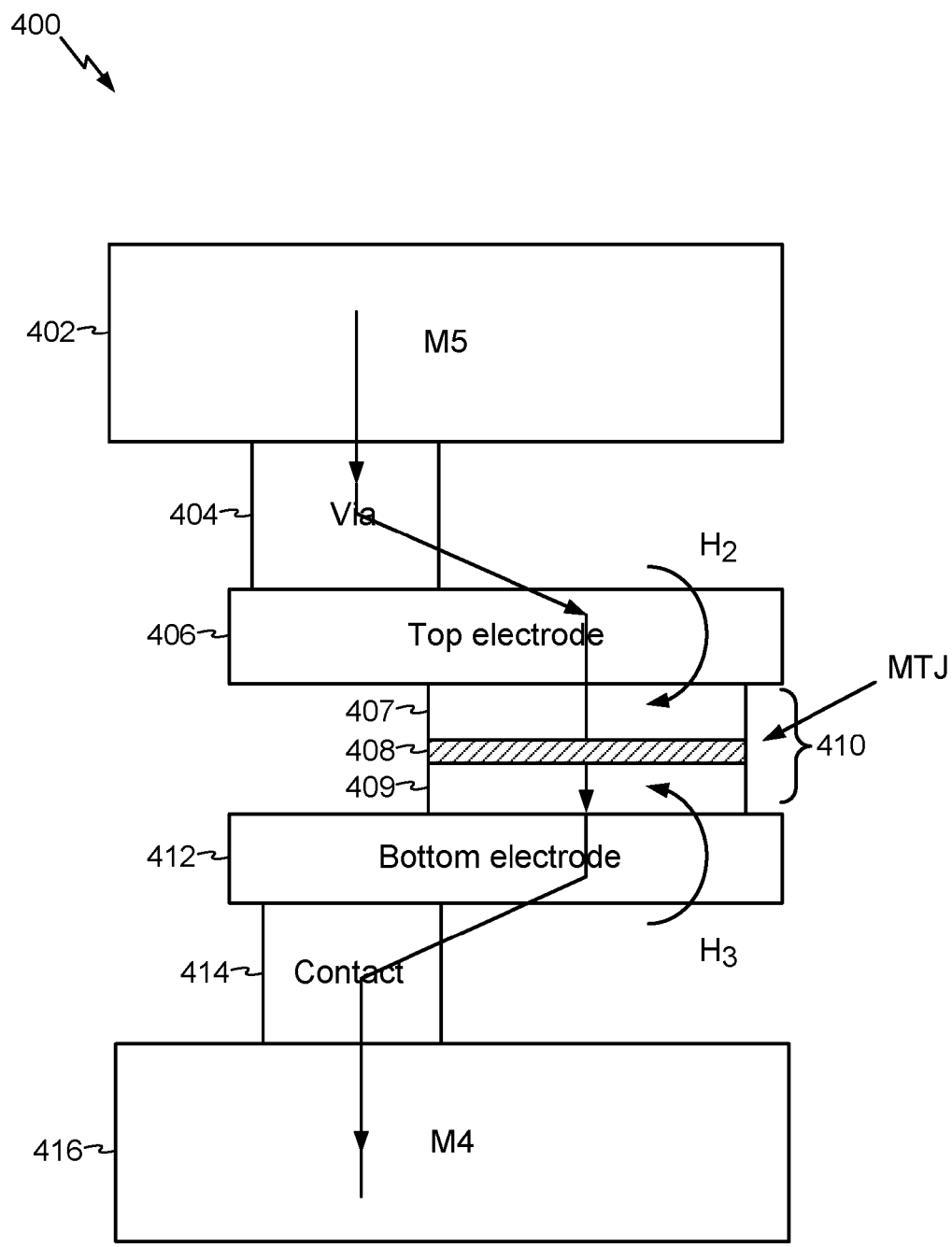
FIG. 4A is a block diagram of an STT-MRAM according to an aspect of the present disclosure.

According to another aspect of the present disclosure described with reference to FIGS. 4A and 4B, the mutually additive portions $H_2$ and $H_3$ of a magnetic field induced by a switching current applied to an MTJ may be directed through the MTJ at an angle to the MTJ's easy axis. FIG. 4A is a block diagram of an STT-MRAM 400 according to an aspect of the present disclosure. The STT-MRAM 400 includes an MTJ 410 that includes a top ferromagnetic layer 407, a bottom ferromagnetic layer 409 and a tunnel barrier layer 408, coupled between the top ferromagnetic layer 407 and the bottom ferromagnetic layer 409. In one implementation, the top ferromagnetic layer 407 may be a free layer and the bottom ferromagnetic layer 409 may be a fixed layer, for example. In another implementation, the top ferromagnetic layer 407 may be a may be a fixed layer and the bottom ferromagnetic layer 409 may be a free layer. The tunnel barrier layer 408 may be made from an insulating material, such as MgO, for example.

The top ferromagnetic layer 407 is coupled to a top electrode 406 and the bottom ferromagnetic layer 409 is coupled to a bottom electrode 412. A top conductive layer 402, such as metal layer M5, is coupled to the top electrode 406 by a top via 404. A bottom conductive layer 416, such as metal layer M4, is coupled to the bottom electrode 412 by a bottom via 414, also referred to as a contact.

Figure 4B:
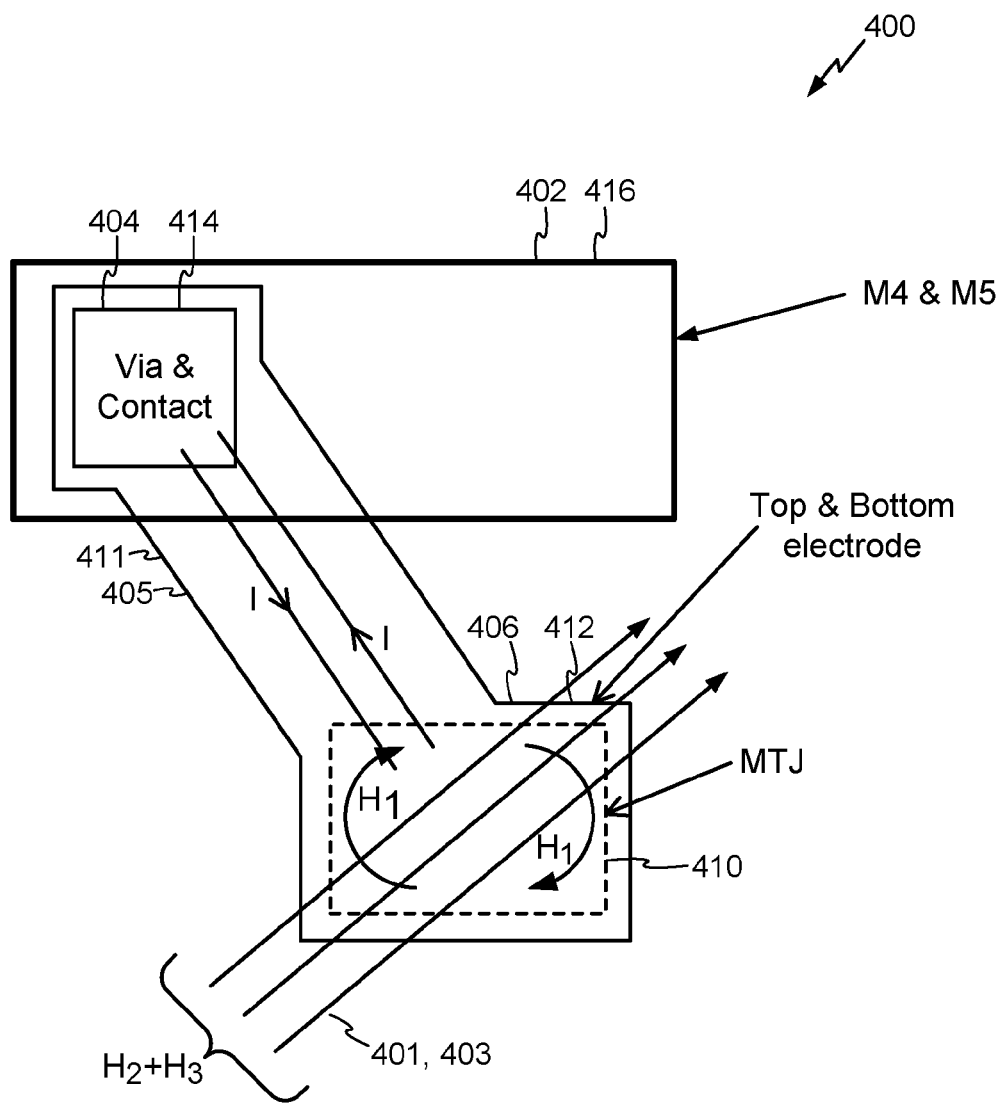
FIG. 4B is a top view diagram of an STT-MRAM according to an aspect of the present disclosure.

FIG. 4B is a top view of the STT-MRAM structure 400 shown in FIG. 4A in which dotted lines denote hidden layers. For instance, in FIG. 4B, the MTJ 410 is hidden under the top electrode 406. The top via 404 and the bottom via 414 are hidden under the top conductive layer 402.

As seen in FIG. 4B, the top conductive layer 402 and bottom conductive layer 416 include portions laterally offset from the MTJ 410. The top electrode 406 includes an elongated portion 405 that extends laterally from the MTJ 410 to the top via 404. The bottom electrode 412 also includes an elongated portion 411 that extends laterally from the MTJ 410 to the bottom via 414.

The top electrode 406 and the bottom electrode 412 are substantially aligned with each other. The elongated portion 405 of the top electrode 406 is also substantially aligned with the elongated portion 411 (shown in FIG. 4B) of the bottom electrode 412. A switching current applied to the MTJ 410 flows along a current path from the top conductive layer 402 to the top electrode 406, through the MTJ 410 to the bottom electrode 412 and then to the bottom conductive layer 416. According to aspects of the present disclosure, the lateral displacement between the top conductive layer 402 and the MTJ 410 causes the switching current to flow laterally, e.g., in a plane parallel to the MTJ layers, in both the top electrode 406 and the bottom electrode 412.

A magnetic field is naturally induced around the current path by the switching current when the switching current is applied to the MTJ 410. As in a conventional MTJ configuration, the switching current traveling through the MTJ from the top ferromagnetic layer 407 to the bottom ferromagnetic layer 409 induces a first portion ($H_1$) (shown in FIG. 4B) of the magnetic field that circulates around the current path parallel to the planes of the MTJ layers 407, 408, 409. According to aspects of the present disclosure, the switching current traveling in the top electrode 406 from the top via 404 to the MTJ 410 induces a second portion ($H_2$) of the magnetic field that circulates around the switching current in the top electrode 406. It should be understood by persons having ordinary skill in the art that the second portion $H_2$ of the magnetic field is directed through the MTJ 410 as shown by the magnetic field vector 401 in the direction shown in FIGS. 4A and 4B.

According to aspects of the present disclosure, the switching current traveling in the bottom electrode 412 from the MTJ 410 to the bottom via 414 induces a third portion ($H_3$) of the magnetic field that circulates around the current in the bottom electrode 412. It should be understood by persons having ordinary skill in the art that the third portion $H_3$ of the magnetic field is directed through the MTJ 410 as shown by the magnetic field vector 403 in the direction shown in FIGS. 4A and 4B.

According to aspects of the present disclosure, the substantial mutual alignment (i.e., pattern) of elongated portions 405, 411 of the top and bottom electrodes 406, 412 causes the second portion $H_2$ of the magnetic field and the third portion $H_3$ of the magnetic field to be mutually additive in one direction through the MTJ 410.

In FIG. 4B, the MTJ 410 has a rectangular shape and the easy axis of the MTJ 410 corresponds to the long axis of the rectangular shape. According to an aspect of the present disclosure, the top electrode 406 and bottom electrode 412 are arranged so that the mutually additive portions $H_2$ and $H_3$ of a magnetic field induced by a switching current applied to the MTJ 410 are directed through the MTJ 410 at an angle relative to the MTJ's easy axis. In one implementation, the angle may be about 45 degrees or 135 degrees, for example.

The mutually additive portions $H_2$ and $H_3$ of a magnetic switching current applied to the MTJ that result from mutually aligned elongated top and bottom electrodes, assist the MTJ to switch states more quickly. The switching is quicker than would occur in response to the same switching current without assistance of the mutually additive portions H2 and H3.

Figure 5:
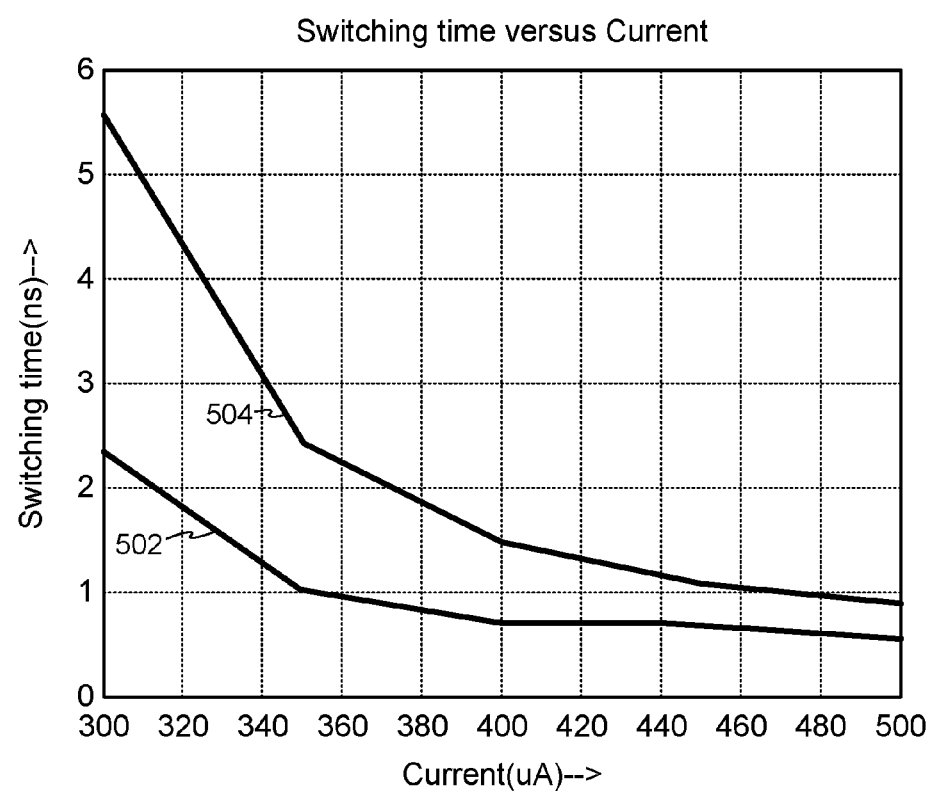
FIG. 5 is a performance graph illustrating switching time versus switching current for an STT-MRAM design according to an aspect of the present disclosure.

FIG. 5 is a graph 500 illustrating a first plot 502 of switching time versus switching current of an STT-MRAM configured according to an aspect of the present disclosure and a second plot 504 of switching time versus switching current of conventional STT-MRAM that is assisted by mutually additive portions of a switching current induced magnetic field as disclosed herein. The first plot 502 and second plot 504, which are based on a micro-magnetic model and Maxwell equations demonstrate a significant reduction in switching time in the STT-MRAM that is configured according to aspects of the present disclosure for a given switching current. The graph 500 shows switching time in nanoseconds (ns) on the y-axis, and switching current in micro-amps (μA) on the x-axis. In one implementation, in which the mutually additive portions $H_2$ and $H_3$ of the switching current induced magnetic field is perpendicular to the easy axis (e.g., FIGS. 2A and 2B), switching of the MTJ may be strongly assisted. Thus, switching may occur more quickly than in the STT-MRAM implementation shown in FIGS. 3A and 3B in which the mutually additive portions $H_2$ and $H_3$ of the switching current induced magnetic field are parallel to the easy axis of the MTJ.

Figure 6:
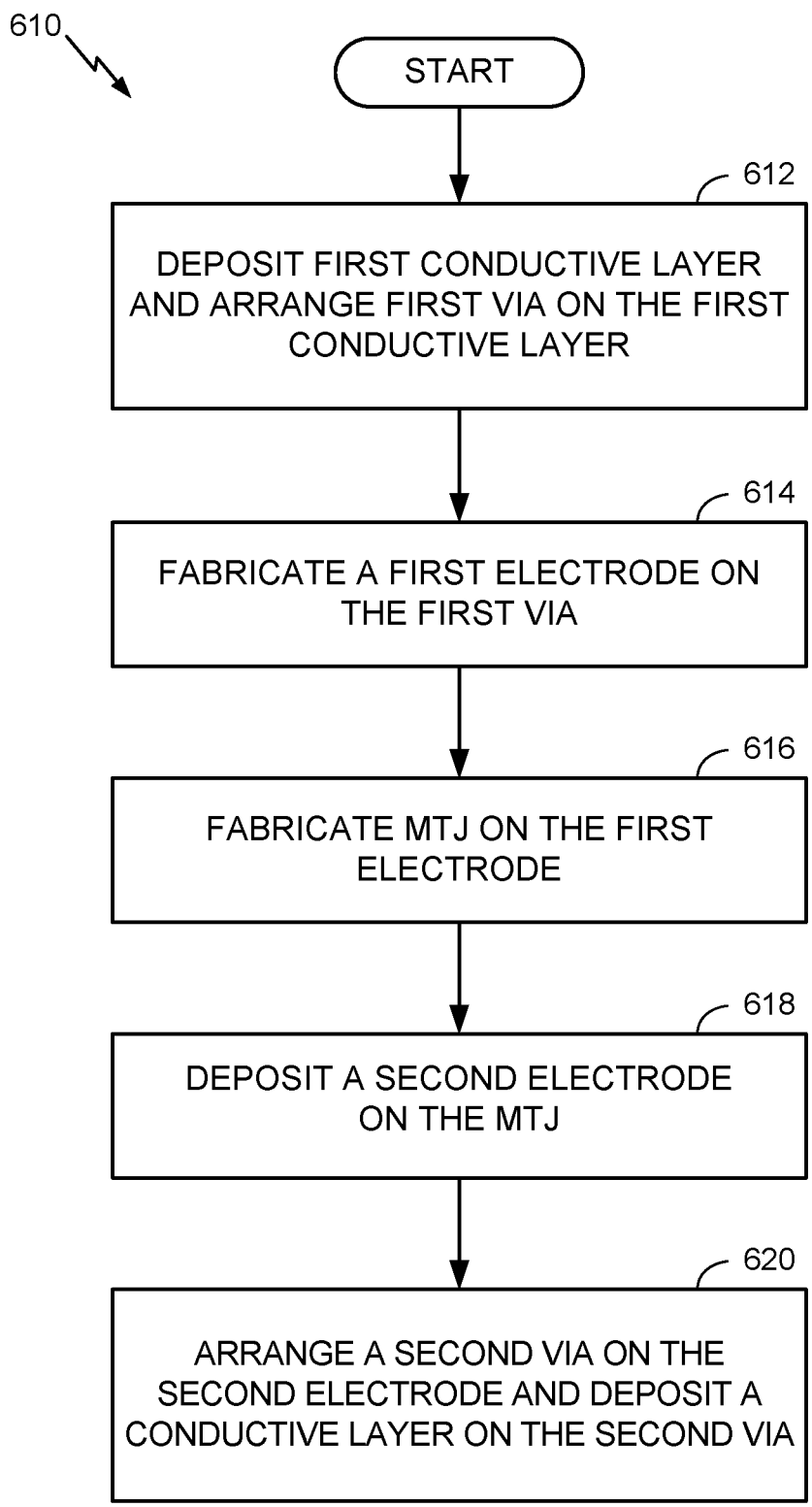
FIG. 6 is a process flow diagram illustrating a method of constructing an STT-MRAM according to an aspect of the present disclosure.

FIG. 6 is a process flow diagram illustrating a method 610 of making a STT-MRAM according to an aspect of the present disclosure. In block 612, a first conductive layer is deposited and a first via is then arranged on the lower conductive layer. In block 614, a first electrode is fabricated on the first via. In block 616, an MTJ is fabricated on the first electrode. The first electrode includes an elongated portion extending away from the MTJ. In block 618, a second electrode is disposed on the MTJ. The top electrode includes an elongated portion extending away from the MTJ. In block 620, a second via is arranged on the top electrode. A conductive layer is then deposited on the top via.

According to aspects of the present disclosure, an STT-MRAM design has local conductive interconnects, including electrodes, configured to control the STT-MRAM current path and the magnetic field distribution to assist the spin logic switching process during band-to-band tunneling. An STT-MRAM design uses an internal STT-MRAM switching current to generate a self-induced magnetic field to assist the spin logic switching process so there is no need to use a separate current source or an external magnetic field. These approaches lead to the reduction of the spin-transfer torque switching time and lower switching power consumption, which results in improved efficiency and performance.

An aspect of the present disclosure includes an apparatus that includes a means for magnetically storing charge, a first means for conducting and a second means for conducting. The means for magnetically storing charge may be, for example, the MTJ 210, the MTJ 310 and/or the MTJ 410. The first means for conducting may be, for example, the top electrode 206, the top electrode 306 and/or the top electrode 406. The second means for conducting may be, for example, the bottom electrode 212, the bottom electrode 312 and/or the bottom electrode 412.

The first means for conducting includes a first means for directing a magnetic field that extends laterally away from the means for magnetically storing charge. The first means for directing magnetic field may be, for example, the elongated portion 205, the elongated portion 305 and/or the elongated portion 405.

The second means for conducting includes a second means for directing a magnetic field that extends laterally away from the means for magnetically storing charge. The second means for directing the magnetic field may be, for example, the elongated portion 211, the elongated portion 311 and/or the elongated portion 411.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
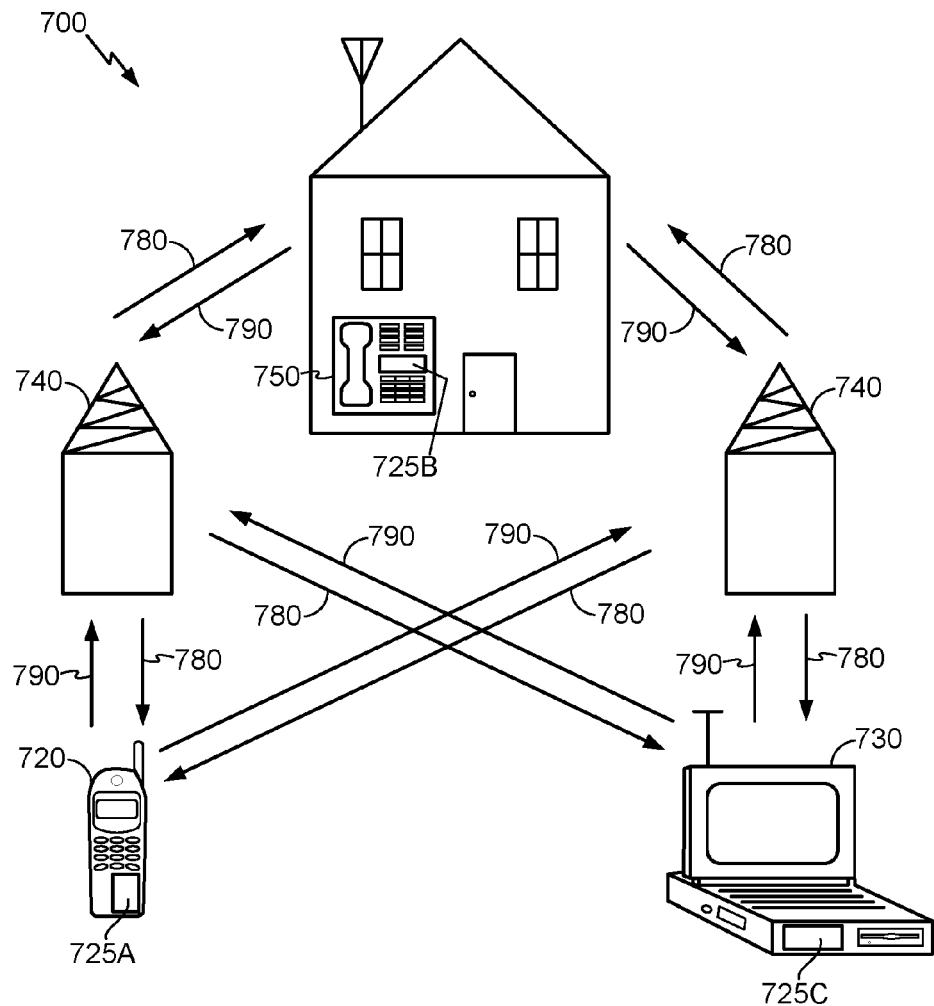
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B that include the disclosed STT-MRAM devices. It will be recognized that other devices may also include the disclosed STT-MRAM devices, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many devices which include the disclosed STT-MRAM devices.

Figure 8:
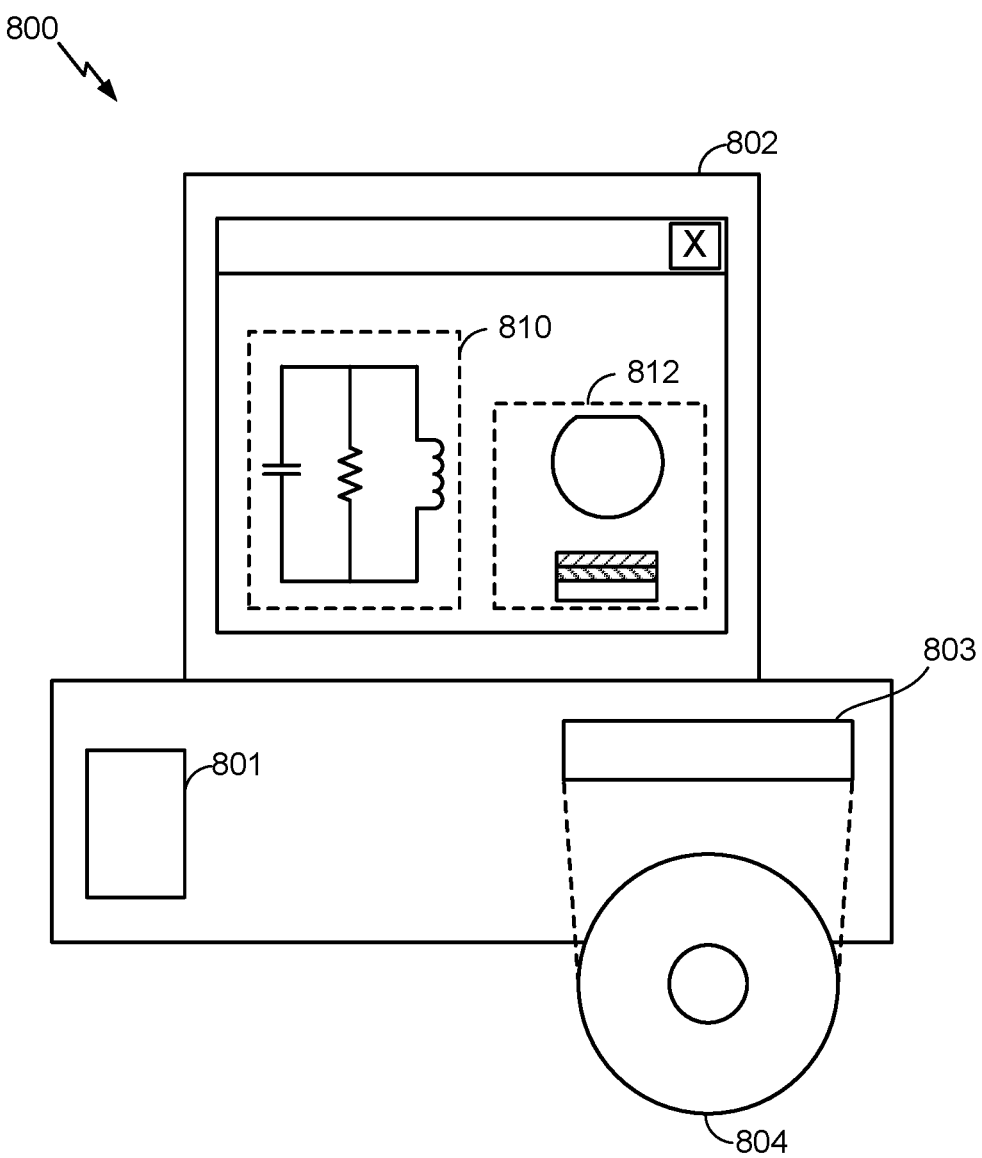
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the STT-MRAM devices disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a one time programming (OTP) apparatus. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "top" and "bottom" are used with respect to a substrate or electronic device. Of course, if the substrate or electronic device is inverted, top becomes bottom, and vice versa. Additionally, if oriented sideways, top and bottom may refer to sides. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of constructing a magnetic memory cell comprising:
    patterning a first electrode;
    coupling a first via to the first electrode;
    fabricating a magnetic tunnel junction (MTJ) comprising a plurality of MTJ layers on the first electrode so that the first electrode has a first elongated portion extending laterally away from the MTJ by a sufficient lateral displacement to cause an MTJ switching current to flow in a first plane parallel the plurality of MTJ layers in the first electrode;
    patterning a second electrode on the MTJ so that the second electrode has a second elongated portion extending laterally away from the MTJ by a sufficient lateral displacement to cause the MTJ switching current to flow in a second plane parallel the plurality of MTJ layers in the first electrode;
    coupling a second via to the second electrode, in which a portion of the MTJ is directly between the first via and the second via; and
    controlling a switching current induced magnetic field by configuring the first elongated portion and the second elongated portion to direct mutually additive portions of the switching current induced magnetic field through the MTJ.

2. The method of claim 1, further comprising:
    depositing a first conductive layer coupled to the first electrode; and
    depositing a second conductive layer coupled to the second electrode.

3. The method of claim 2, in which:
    the first via is coupled between the first conductive layer and the first electrode; and
    the second via is coupled between the second conductive layer and the second electrode.

4. The method of claim 1, further comprising:
    defining an easy axis with respect to the MTJ; and
    configuring the first elongated portion and the second elongated portion to induce the switching current induced magnetic field parallel to the easy axis of the MTJ.

5. The method of claim 1, further comprising:
    defining an easy axis with respect to the MTJ; and
    configuring the first elongated portion and the second elongated portion to induce the switching current induced magnetic field perpendicular to the easy axis of the MTJ.

6. The method of claim 1, further comprising:
    defining an easy axis with respect to the MTJ; and
    configuring the first elongated portion and the second elongated portion to induce the switching current induced magnetic field at an angle to the easy axis of the MTJ.

7. The method of claim 1, in which the first electrode and the second electrode have substantially a same pattern.

8. The method of claim 1, further comprising integrating the magnetic memory cell into a mobile phone, a set top box, a music player, a video player, an entertainment unit, a navigation device, a computer, a hand-held personal communication systems (PCS) unit, a portable data unit, and/or a fixed location data unit.

9. A method of constructing a magnetic memory cell comprising:
    the step for patterning a first electrode;
    the step for coupling a first via to the first electrode;
    the step for fabricating a magnetic tunnel junction (MTJ) comprising a plurality of MTJ layers on the first electrode so that the first electrode has a first elongated portion extending laterally away from the MTJ by a sufficient lateral displacement to cause a switching current to flow in a first plane parallel the plurality of MTJ layers in the first electrode;
    the step for patterning a second electrode on the MTJ so that the second electrode has a second elongated portion extending laterally away from the MTJ by a sufficient lateral displacement to cause the switching current to flow in a second plane parallel the plurality of MTJ layers in the first second;
    the step for coupling a second via to the second electrode, in which a portion of the MTJ is directly between the first via and the second via; and
    the step for controlling a switching current induced magnetic field by configuring the first elongated portion and the second elongated portion to direct mutually additive portions of a switching current induced magnetic field through the MTJ.

10. The method of claim 9, further comprising:
the step for depositing a first conductive layer coupled to the first electrode; and
the step for depositing a second conductive layer coupled to the second electrode.

11. The method of claim 10, in which:
the first via is coupled between the first conductive layer and the first electrode; and
the second via is coupled between the second conductive layer and the second electrode.

12. The method of claim 9, further comprising:
the step for defining an easy axis with respect to the MTJ; and
the step for configuring the first elongated portion and the second elongated portion to induce the switching current induced magnetic field parallel to the easy axis of the MTJ.

13. The method of claim 9, further comprising:
the step for defining an easy axis with respect to the MTJ; and
the step for configuring the first elongated portion and the second elongated portion to induce the switching current induced magnetic field perpendicular to the easy axis of the MTJ.

14. The method of claim 9, further comprising:
the step for defining an easy axis with respect to the MTJ; and
the step for configuring the first elongated portion and the second elongated portion to induce the switching current induced magnetic field at an angle to the easy axis of the MTJ.

15. The method of claim 9, in which the first electrode and the second electrode have substantially a same pattern.

16. The method of claim 9, further comprising integrating the magnetic memory cell into a mobile phone, a set top box, a music player, a video player, an entertainment unit, a navigation device, a computer, a hand-held personal communication systems (PCS) unit, a portable data unit, and/or a fixed location data unit.

17. A method of constructing a magnetic memory cell comprising:
depositing a first conductive layer;
arranging a first contact via on the first conductive layer;
fabricating a first electrode on the first contact via;
fabricating an MTJ on the first electrode, in which the first electrode includes a first elongated portion extending away from the MTJ;
fabricating a second electrode on the MTJ, in which the second electrode includes a second elongated portion extending away from the MTJ;
arranging a second contact via on the second electrode, in which a portion of the MTJ is directly between the first contact via and the second contact via; and
depositing a conductive layer on the second contact via.

18. The method of claim 17, further comprising arranging a lateral displacement between the first elongated portion and the second elongated portion relative to the MTJ to direct mutually additive portions of a switching current induced magnetic field through the MTJ.

19. The method of claim 17, further comprising:
aligning the second contact via with the first contact via and the portion of MTJ disposed directly between the first contact via and the second contact via to direct a first portion of a magnetic field induced by the MTJ from the first contact via through the MTJ; and
arranging a lateral displacement between the second elongated portion and the MTJ to direct a second portion of the magnetic field induced by the MTJ and the second contact via, the second portion of the magnetic field adding with the first portion of the magnetic field to enhance the magnetic field through the MTJ.

20. The method of claim 17, further comprising integrating the magnetic memory cell into a mobile phone, a set top box, a music player, a video player, an entertainment unit, a navigation device, a computer, a hand-held personal communication systems (PCS) unit, a portable data unit, and/or a fixed location data unit.

* * * * *